United States Patent
Lin et al.

(10) Patent No.: US 7,868,370 B2
(45) Date of Patent: *Jan. 11, 2011

(54) SINGLE GATE NONVOLATILE MEMORY CELL WITH TRANSISTOR AND CAPACITOR

(75) Inventors: Cheng-Chi Lin, Toucheng Township (TW); Shih-Chin Lien, Sinjhuang (TW); Chin-Pen Yeh, Hsinchu (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 221 days.

This patent is subject to a terminal disclaimer.

(21) Appl. No.: 12/102,608

(22) Filed: Apr. 14, 2008

(65) Prior Publication Data

US 2009/0256183 A1    Oct. 15, 2009

(51) Int. Cl.
*H01L 27/105* (2006.01)
*H01L 21/8239* (2006.01)

(52) U.S. Cl. .............. 257/298; 257/296; 257/E27.081; 257/E21.645

(58) Field of Classification Search .......... 257/290–330
See application file for complete search history.

(56) References Cited

U.S. PATENT DOCUMENTS

| | | | |
|---|---|---|---|
| 5,068,697 A | 11/1991 | Noda et al. | |
| 5,635,416 A | 6/1997 | Chen et al. | |
| 6,184,089 B1 | 2/2001 | Chang et al. | |
| 6,410,389 B1 | 6/2002 | Cappelletti et al. | |
| 6,642,112 B1 | 11/2003 | Lowe et al. | |
| 6,849,510 B2 | 2/2005 | Lowe et al. | |
| 7,099,192 B2 | 8/2006 | Wang et al. | |
| 2001/0045594 A1 | 11/2001 | Chang | |
| 2004/0072397 A1 | 4/2004 | Lowe et al. | |
| 2006/0022255 A1 | 2/2006 | Yao et al. | |
| 2006/0118856 A1 | 6/2006 | Lojek | |
| 2006/0199334 A1 | 9/2006 | Park et al. | |
| 2006/0267071 A1 | 11/2006 | Carver et al. | |

FOREIGN PATENT DOCUMENTS

TW    254320    5/2006
TW    200636978    10/2006

*Primary Examiner*—Matthew S Smith
*Assistant Examiner*—Mamadou Diallo
(74) *Attorney, Agent, or Firm*—Kenta Suzue; Haynes Beffel & Wolfeld LLP

(57) ABSTRACT

A nonvolatile memory integrated circuit has a semiconductor substrate and a nonvolatile memory device on the semiconductor substrate. The device has a transistor and a capacitor on the semiconductor substrate, and a shared floating gate connecting the gate regions of the transistor and the capacitor. The transistor has at least a doping region defining the source and drain regions, as well as three other doping regions overlapping the source and drain regions. Also disclosed are a nonvolatile memory circuit with multiple such nonvolatile memory device, and methods for making the nonvolatile memory circuit with one or more such nonvolatile memory devices.

21 Claims, 16 Drawing Sheets

US 7,868,370 B2

SINGLE GATE NONVOLATILE MEMORY CELL WITH TRANSISTOR AND CAPACITOR

BACKGROUND

1. Field

The technology is related to nonvolatile memory integrated circuits, and in particular nonvolatile memory integrated circuits with single gate memory cells including both a transistor and a capacitor.

2. Description of Related Art

An example of nonvolatile memory cells, such as one time programming (OTP) memory cells is the single gate memory cell which includes both a transistor and a capacitor. Examples of such nonvolatile memory cells are described in U.S. Pat. Nos. 6,054,732; 6,875,648; 6,025,625; and 5,896,315; as well as US Patent Application Publication No. 2006/0022255.

SUMMARY

One aspect of the technology is a nonvolatile memory integrated circuit, comprising a semiconductor substrate, and a nonvolatile memory device on the semiconductor substrate. The nonvolatile memory device includes a transistor on the semiconductor substrate and a capacitor on the semiconductor substrate. The transistor is controlled by a gate region, a source region, and a drain region. The capacitor is controlled by a gate region. The transistor has multiple doping regions. One doping region is positioned on both sides of the gate region and defines the source and drain regions, and has a doping type such as n-type. There at least three more doping regions, which are positioned on both side of the gate region, and overlap the source and drain regions, two of which have the same doping type as the source and drain regions (such as n-type) and the third which has the opposite doping type as the source and drain regions (such as p-type). A shared floating gate connects the gate region of the transistor and the gate region of the capacitor.

In some embodiments, the substrate has a doping type opposite (e.g., p-type) to that of the source and drain regions.

Some embodiments further comprise an epitaxial layer having a doping type opposite (e.g., p-type) to that of the source and drain regions. In various embodiments, the epitaxial layer acts as the base for structures such as the transistor and the capacitor.

Various embodiments have a well with a doping type opposite (e.g., p-type) to that of the source and drain regions, the same (e.g., n-type) as that of the source and drain regions, or both such wells. Some embodiments have a transistor on one such well, a capacitor on one such well, both the transistor and capacitor in one such well, and both the transistor and capacitor in different such wells.

Some embodiments include spacers adjacent to the gate region of the transistor, which partly cover the doping regions besides the source and drain regions.

Some embodiments include control circuitry applying bias arrangements of memory operations to the nonvolatile memory device(s).

Another aspect of the technology is a nonvolatile memory integrated circuit with multiple nonvolatile memory devices including a transistor and a capacitor described herein.

Another aspect of the technology is a method of making nonvolatile memory integrated circuits described herein.

DETAILED DESCRIPTION

Figure 1:
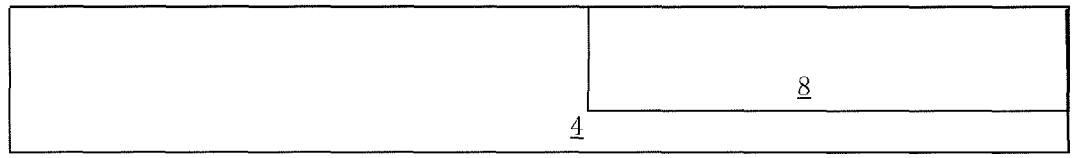
FIG. 1 shows a cross-sectional view of part of the process of FIGS. 1-13 of making a single gate memory cell with a transistor and a capacitor in different wells having different doping types, in particular implanting an n-well.

FIG. 1 shows a cross-sectional view of part of the process of FIGS. 1-13 of making a single gate memory cell with a transistor and a capacitor in different wells having different doping types, in particular implanting an n-well 8.

Figure 2:
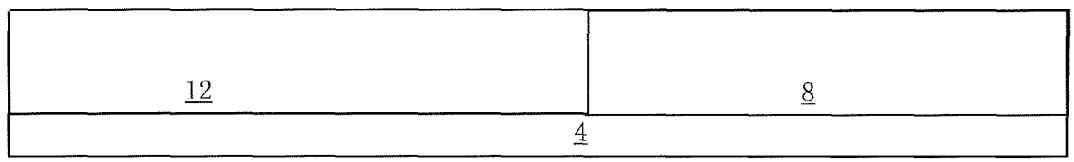
FIG. 2 shows a cross-sectional view of part of the process of FIGS. 1-13 of making a single gate memory cell with a transistor and a capacitor in different wells having different doping types, in particular implanting a p-well.

FIG. 2 shows a cross-sectional view of part of the process of FIGS. 1-13 of making a single gate memory cell with a transistor and a capacitor in different wells having different doping types, in particular implanting a p-well 12.

Figure 3:
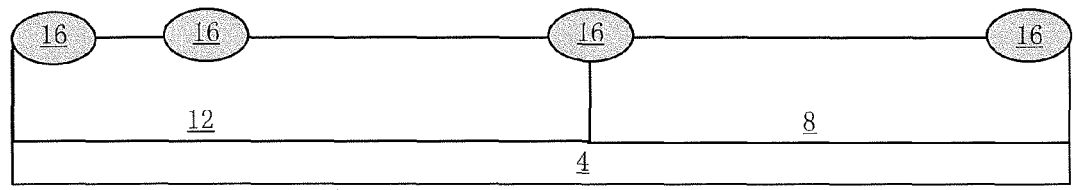
FIG. 3 shows a cross-sectional view of part of the process of FIGS. 1-13 of making a single gate memory cell with a transistor and a capacitor in different wells having different doping types, in particular growing isolation oxide between structures.

FIG. 3 shows a cross-sectional view of part of the process of FIGS. 1-13 of making a single gate memory cell with a transistor and a capacitor in different wells having different doping types, in particular growing isolation oxide 16 between structures.

Figure 4:
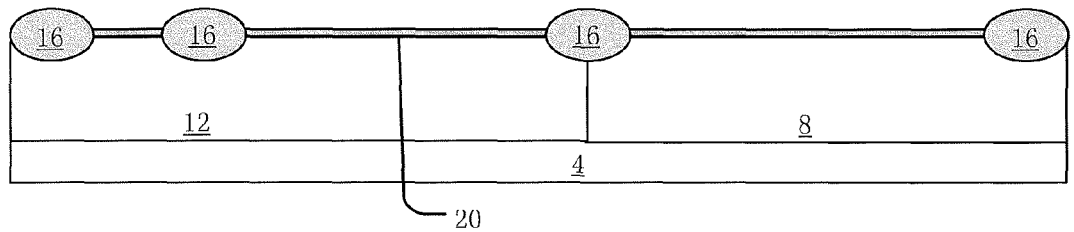
FIG. 4 shows a cross-sectional view of part of the process of FIGS. 1-13 of making a single gate memory cell with a transistor and a capacitor in different wells having different doping types, in particular growing gate oxide for the transistor and the capacitor.

FIG. 4 shows a cross-sectional view of part of the process of FIGS. 1-13 of making a single gate memory cell with a transistor and a capacitor in different wells having different doping types, in particular growing gate oxide 20 for the transistor and the capacitor.

Figure 5:
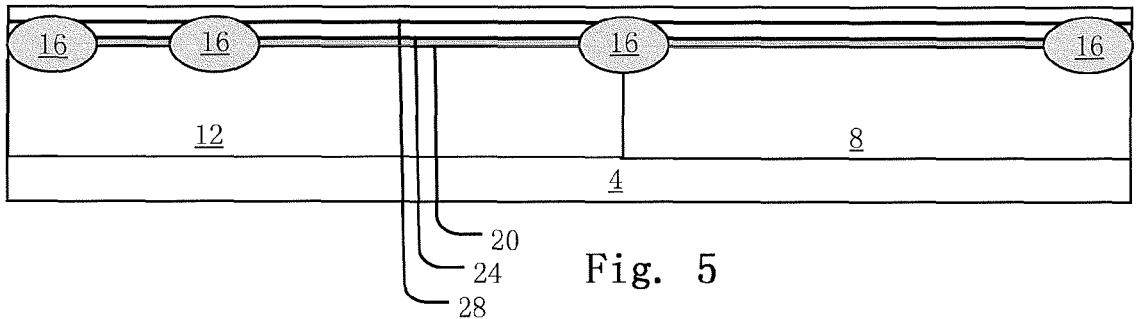
FIG. 5 shows a cross-sectional view of part of the process of FIGS. 1-13 of making a single gate memory cell with a transistor and a capacitor in different wells having different doping types, in particular depositing polysilicon and WSi.

FIG. 5 shows a cross-sectional view of part of the process of FIGS. 1-13 of making a single gate memory cell with a transistor and a capacitor in different wells having different doping types, in particular depositing polysilicon 24 and WSi 28.

Figure 6:
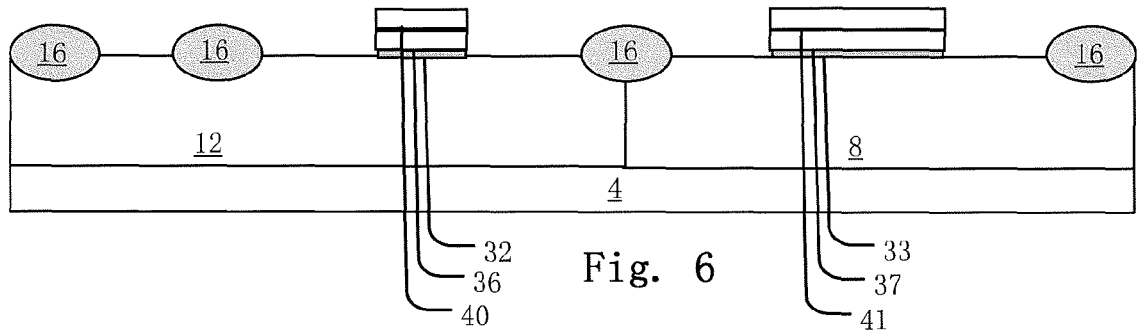
FIG. 6 shows a cross-sectional view of part of the process of FIGS. 1-13 of making a single gate memory cell with a transistor and a capacitor in different wells having different doping types, in particular etching polysilicon and WSi to define the gate regions.

FIG. 6 shows a cross-sectional view of part of the process of FIGS. 1-13 of making a single gate memory cell with a transistor and a capacitor in different wells having different doping types, in particular etching polysilicon and WSi to define the gate regions 32, 36, and 40 of the transistor and 33, 37, and 41 of the capacitor.

Figure 7:
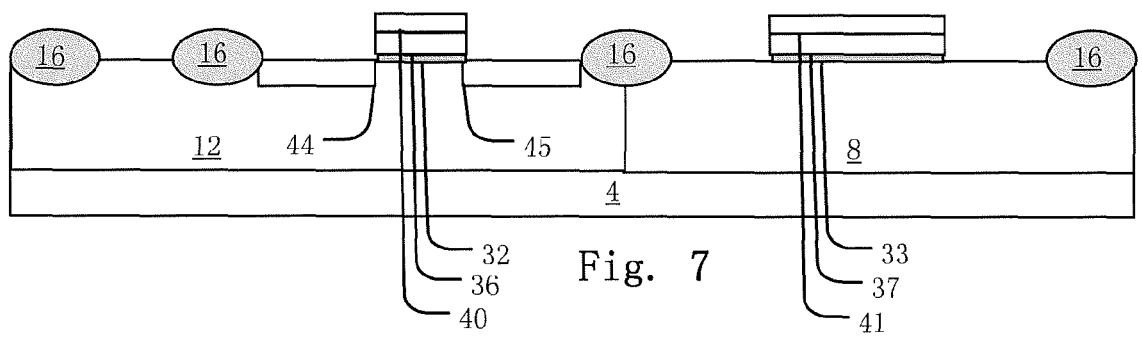
FIG. 7 shows a cross-sectional view of part of the process of FIGS. 1-13 of making a single gate memory cell with a transistor and a capacitor in different wells having different doping types, in particular implanting N− doping regions (having the same doping type as the N+ source and drain regions to be formed), on both sides of the gate region of the transistor and overlapping the source and drain regions to be formed.

FIG. 7 shows a cross-sectional view of part of the process of FIGS. 1-13 of making a single gate memory cell with a transistor and a capacitor in different wells having different doping types, in particular implanting N– doping regions 44 and 45 (having the same doping type as the N+ source and drain regions to be formed), on both sides of the gate region of the transistor and overlapping the source and drain regions to be formed.

Figure 8:
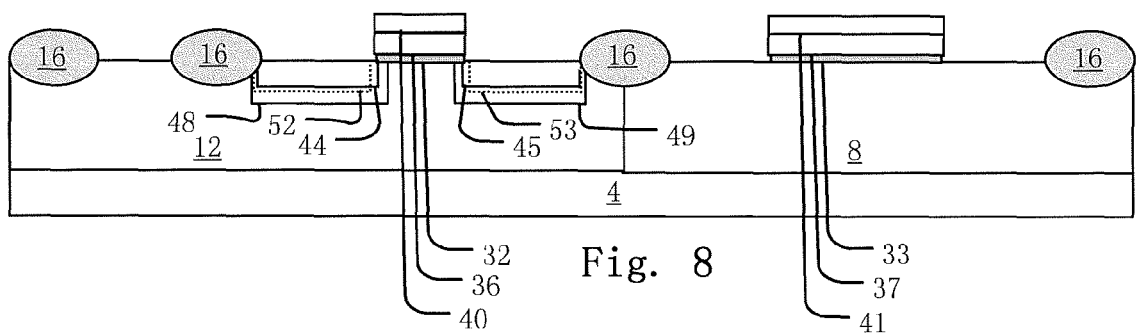
FIG. 8 shows a cross-sectional view of part of the process of FIGS. 1-13 of making a single gate memory cell with a transistor and a capacitor in different wells having different doping types, in particular implanting two additional doping regions on both sides of the gate region of the transistor and overlapping the source and drain regions to be formed, one having the opposite (P) doping type as the source and drain regions to be formed, and another one having the same (N) doping type as the source and drain regions to be formed.

FIG. 8 shows a cross-sectional view of part of the process of FIGS. 1-13 of making a single gate memory cell with a transistor and a capacitor in different wells having different doping types, in particular implanting two additional doping regions on both sides of the gate region of the transistor and overlapping the source and drain regions to be formed, one (48 and 49) having the opposite (P) doping type as the source and drain regions to be formed, and another one (52 and 53) having the same (N) doping type as the source and drain regions to be formed.

Figure 9:
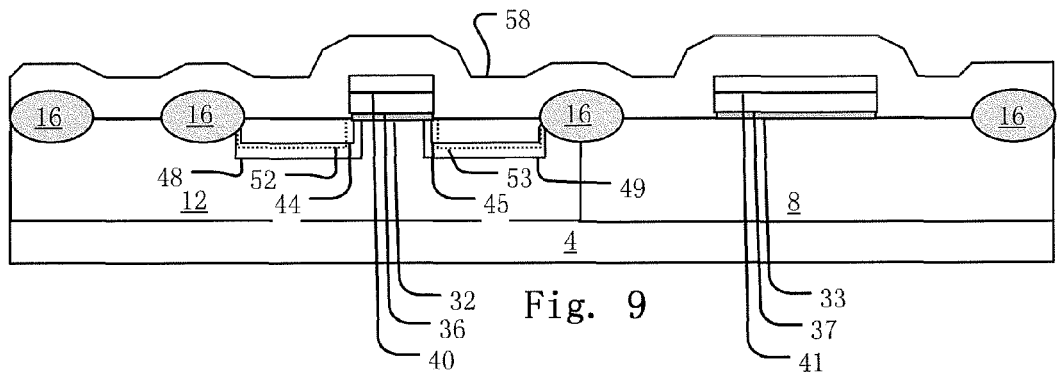
FIG. 9 shows a cross-sectional view of part of the process of FIGS. 1-13 of making a single gate memory cell with a transistor and a capacitor in different wells having different doping types, in particular depositing a layer of oxide.

FIG. 9 shows a cross-sectional view of part of the process of FIGS. 1-13 of making a single gate memory cell with a transistor and a capacitor in different wells having different doping types, in particular depositing a layer of oxide 58.

Figure 10:
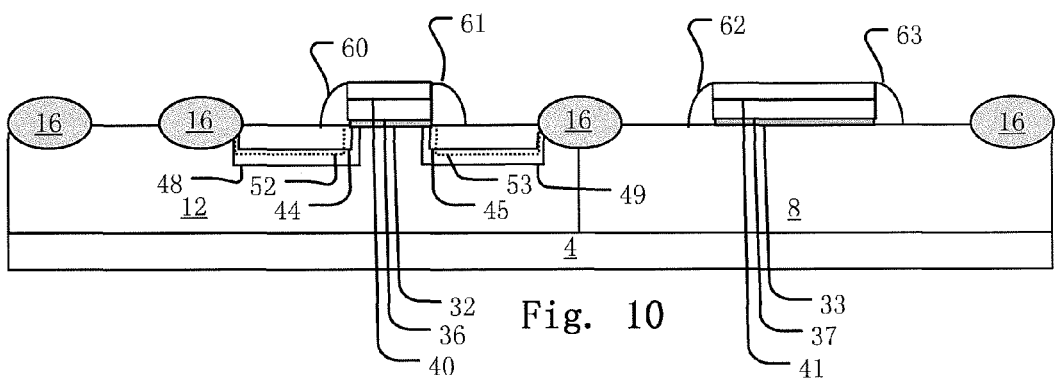
FIG. 10 shows a cross-sectional view of part of the process of FIGS. 1-13 of making a single gate memory cell with a transistor and a capacitor in different wells having different doping types, in particular etching the layer of oxide to form sidewall spacers by the gate region.

FIG. 10 shows a cross-sectional view of part of the process of FIGS. 1-13 of making a single gate memory cell with a transistor and a capacitor in different wells having different doping types, in particular etching the layer of oxide to form sidewall spacers 60 and 61 by the gate region of the transistor and sidewall spacers 62 and 63 by the gate region of the capacitor.

Figure 11:
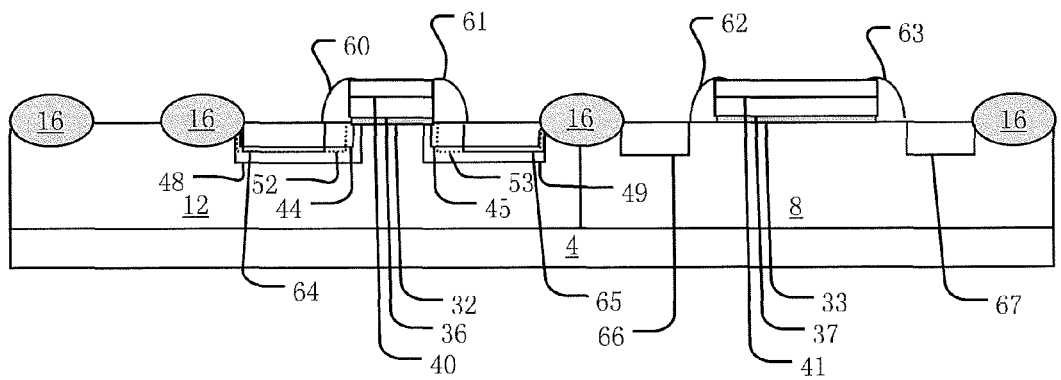
FIG. 11 shows a cross-sectional view of part of the process of FIGS. 1-13 of making a single gate memory cell with a transistor and a capacitor in different wells having different doping types, in particular implanting the source and drain regions (N+) on either side of the gate region of the transistor, and regions having the same doping type (N+) on either side of the gate region of the capacitor.

FIG. 11 shows a cross-sectional view of part of the process of FIGS. 1-13 of making a single gate memory cell with a transistor and a capacitor in different wells having different doping types, in particular implanting the source and drain regions (N+) 64 and 65 on either side of the gate region of the transistor, and regions 66 and 67 having the same doping type (N+) on either side of the gate region of the capacitor.

Figure 12:
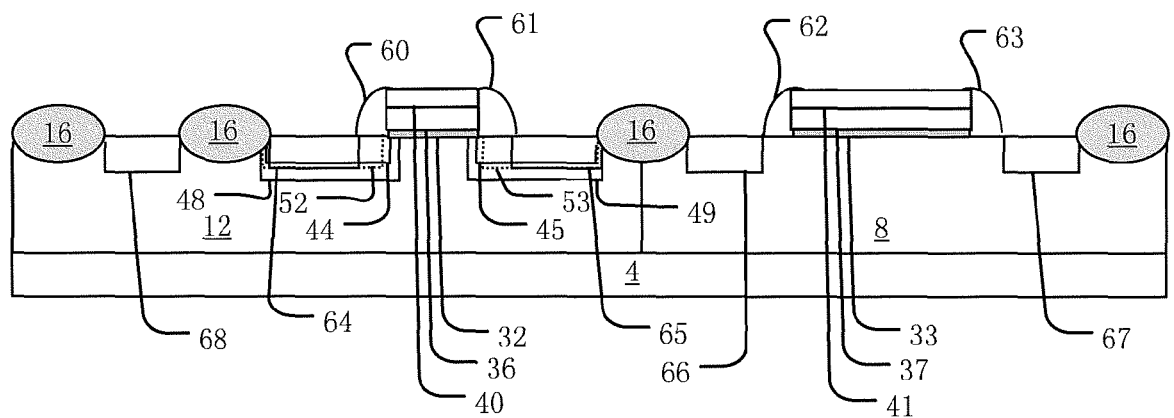
FIG. 12 shows a cross-sectional view of part of the process of FIGS. 1-13 of making a single gate memory cell with a transistor and a capacitor in different wells having different doping types, in particular implanting a region having the opposite doping type (P+) as the source and drain regions.

FIG. 12 shows a cross-sectional view of part of the process of FIGS. 1-13 of making a single gate memory cell with a transistor and a capacitor in different wells having different doping types, in particular implanting a region 68 having the opposite doping type (P+) as the source and drain regions.

Figure 13:
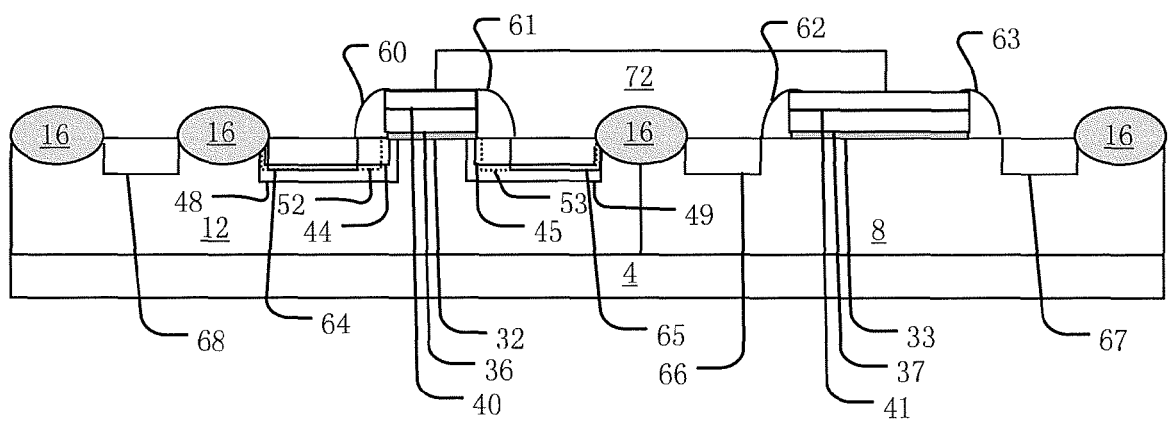
FIG. 13 shows a cross-sectional view of part of the process of FIGS. 1-13 of making a single gate memory cell with a transistor and a capacitor in different wells having different doping types, in particular depositing the single gate connecting the gate regions of the transistor and the capacitor.

FIG. 13 shows a cross-sectional view of part of the process of FIGS. 1-13 of making a single gate memory cell with a transistor and a capacitor in different wells having different doping types, in particular depositing the single gate 72 connecting the gate regions of the transistor and the capacitor.

Figure 14:
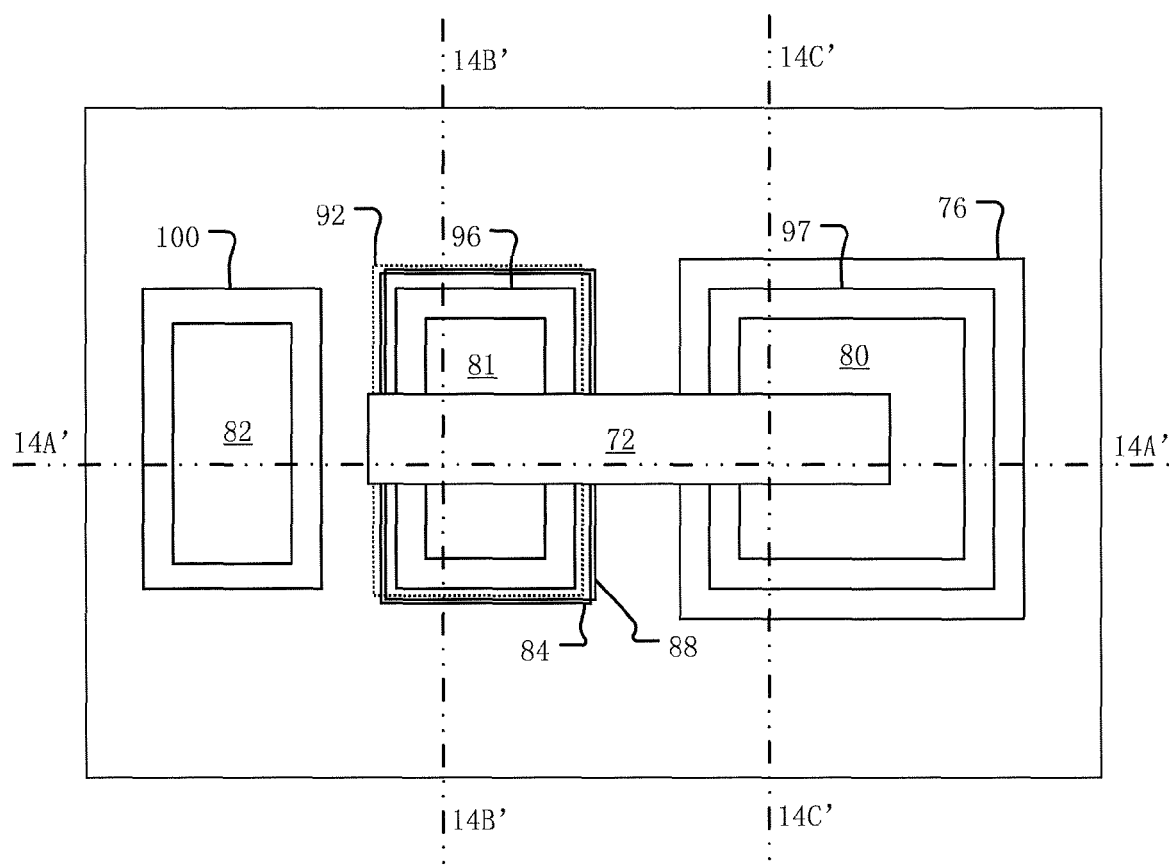
FIG. 14 shows a top view of a single gate memory cell with a transistor and a capacitor in different wells having different doping types.

FIG. 14 shows a top view of a single gate memory cell with a transistor and a capacitor in different wells having different doping types. Oxide definition window 82 partly covers P+ implant window 100. Oxide definition window 81 partly covers N+ implant window 96. N+ implant window 96 partly covers N– doping window 84, P doping window 88, and N doping window 92. Oxide definition window 80 partly covers N+ implant window 97. N+ implant window 97 partly covers N– well implant window 76. Floating gate 72 overlaps both oxide definition windows 80 and 81. Cross-sectional lines 14A'-14A', 14B'-14B', and 14C'-14C' designate the cross-sectional views of FIGS. 14A-14C.

Figure 14A:
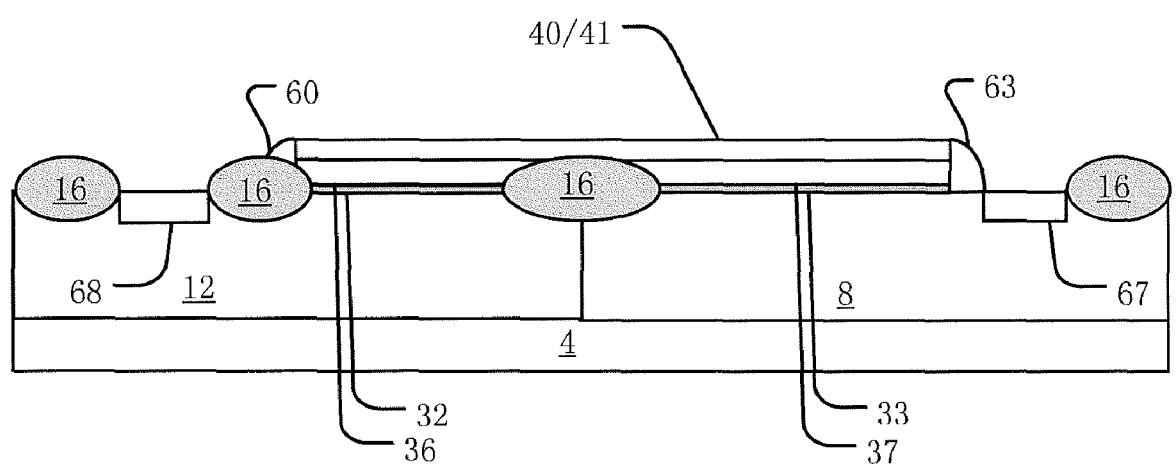
FIGS. 14A-C show cross-sectional views of the single gate memory cell with the transistor and the capacitor in different wells having different doping types, of FIG. 14.
Figure 14B:
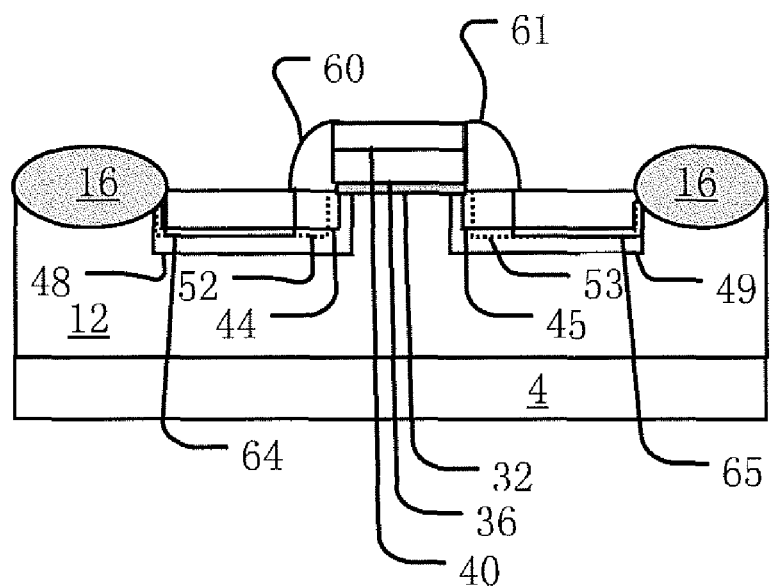
Figure 14C:
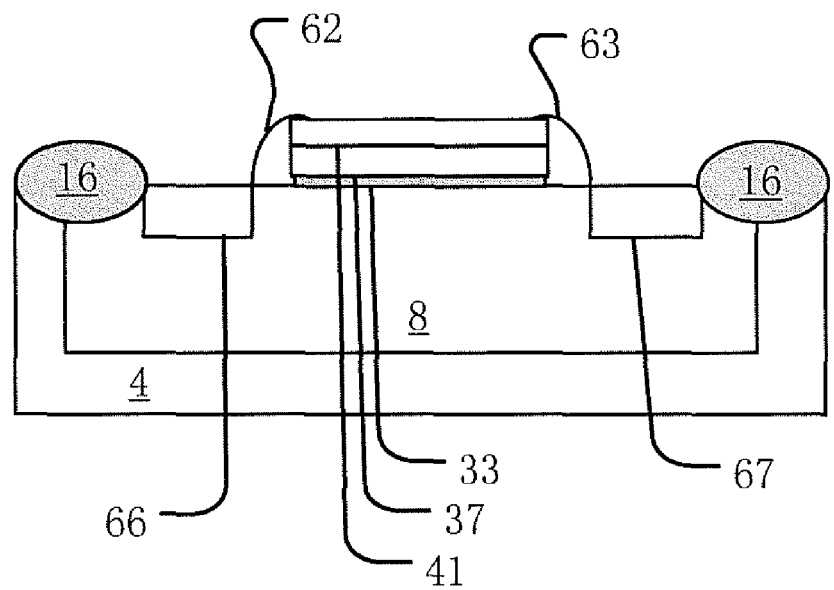

FIGS. 14A-C show cross-sectional views of the single gate memory cell with the transistor and the capacitor in different wells having different doping types, of FIG. 14. FIG. 14A shows the cross-section corresponding to cross-sectional line 14A'-14A' in FIG. 14. FIG. 14B shows the cross-section corresponding to cross-sectional line 14B'-14B' in FIG. 14. FIG. 14C shows the cross-section corresponding to cross-sectional line 14C'-14C' in FIG. 14.

Figure 15:
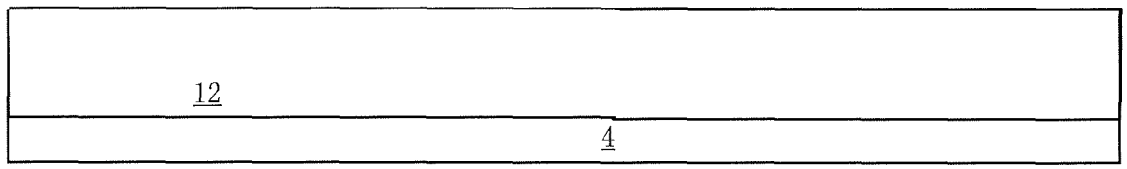
FIG. 15 shows a cross-sectional view of part of the process of FIGS. 15-26 of making a single gate memory cell with a transistor and a capacitor in the same well, in particular implanting a p-well, and resembles the step of FIG. 2.

FIG. 15 shows a cross-sectional view of part of the process of FIGS. 15-26 of making a single gate memory cell with a transistor and a capacitor in the same well, in particular implanting a p-well 12, and resembles the step of FIG. 2.

Figure 16:
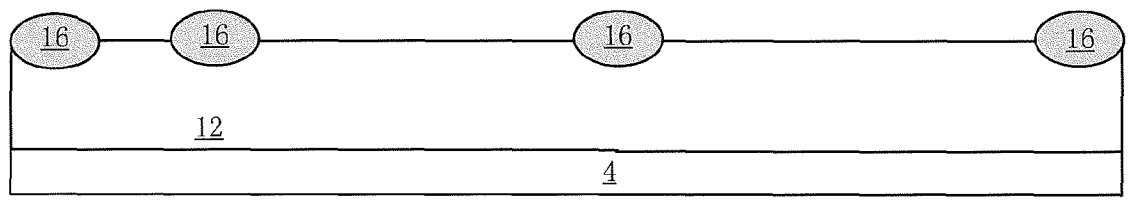
FIG. 16 shows a cross-sectional view of part of the process of FIGS. 15-26 of making a single gate memory cell with a transistor and a capacitor in the same well, in particular growing isolation oxide between structures, and resembles the step of FIG. 3.

FIG. 16 shows a cross-sectional view of part of the process of FIGS. 15-26 of making a single gate memory cell with a transistor and a capacitor in the same well, in particular growing isolation oxide 16 between structures, and resembles the step of FIG. 3.

Figure 17:
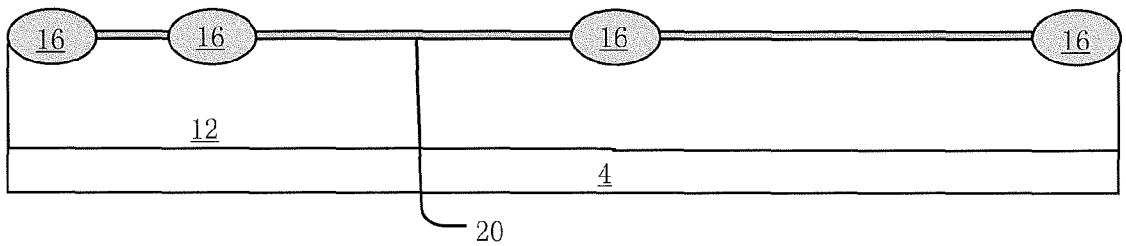
FIG. 17 shows a cross-sectional view of part of the process of FIGS. 15-26 of making a single gate memory cell with a transistor and a capacitor in the same well, in particular growing gate oxide for the transistor and the capacitor, and resembles the step of FIG. 4.

FIG. 17 shows a cross-sectional view of part of the process of FIGS. 15-26 of making a single gate memory cell with a transistor and a capacitor in the same well, in particular growing gate oxide 20 for the transistor and the capacitor, and resembles the step of FIG. 4.

Figure 18:
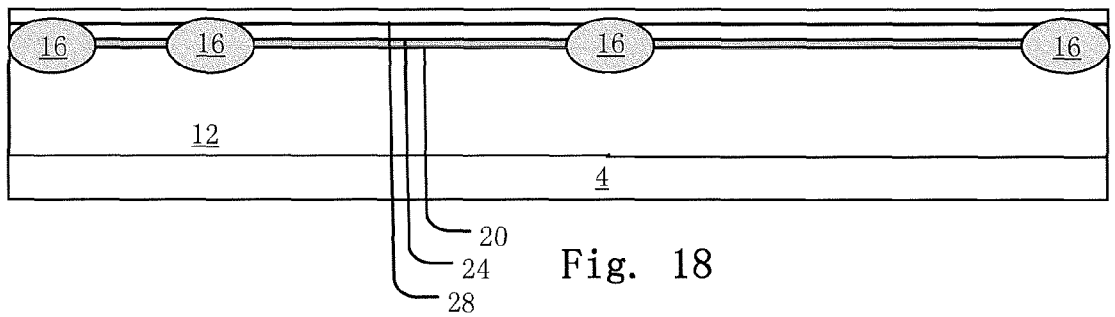
FIG. 18 shows a cross-sectional view of part of the process of FIGS. 15-26 of making a single gate memory cell with a transistor and a capacitor in the same well, in particular depositing polysilicon and WSi, and resembles the step of FIG. 5.

FIG. 18 shows a cross-sectional view of part of the process of FIGS. 15-26 of making a single gate memory cell with a transistor and a capacitor in the same well, in particular depositing polysilicon and WSi 24 and 28, and resembles the step of FIG. 5.

Figure 19:
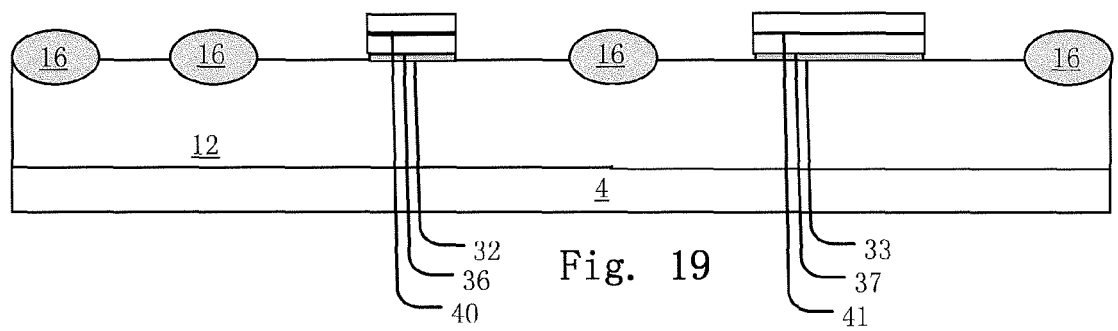
FIG. 19 shows a cross-sectional view of part of the process of FIGS. 15-26 of making a single gate memory cell with a transistor and a capacitor in the same well, in particular etching polysilicon and WSi to define the gate regions, and resembles the step of FIG. 6.

FIG. 19 shows a cross-sectional view of part of the process of FIGS. 15-26 of making a single gate memory cell with a transistor and a capacitor in the same well, in particular etching polysilicon and WSi to define the gate regions 32, 36, and 40 of the transistor and 33, 37, and 41 of the capacitor, and resembles the step of FIG. 6.

Figure 20:
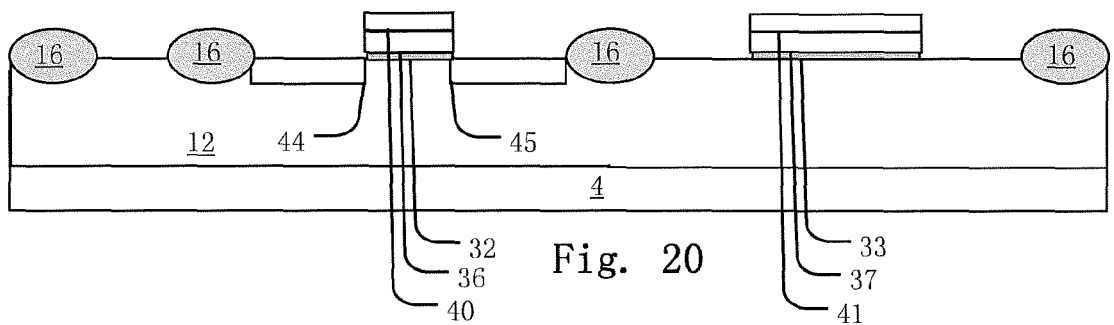
FIG. 20 shows a cross-sectional view of part of the process of FIGS. 15-26 of making a single gate memory cell with a transistor and a capacitor in the same well, in particular implanting N– doping regions (having the same doping type as the N+ source and drain regions to be formed), on both sides of the gate region of the transistor and overlapping the source and drain regions to be formed, and resembles the step of FIG. 7.

FIG. 20 shows a cross-sectional view of part of the process of FIGS. 15-26 of making a single gate memory cell with a transistor and a capacitor in the same well, in particular implanting N– doping regions 44 and 45 (having the same doping type as the N+ source and drain regions to be formed), on both sides of the gate region of the transistor and overlapping the source and drain regions to be formed, and resembles the step of FIG. 7.

Figure 21:
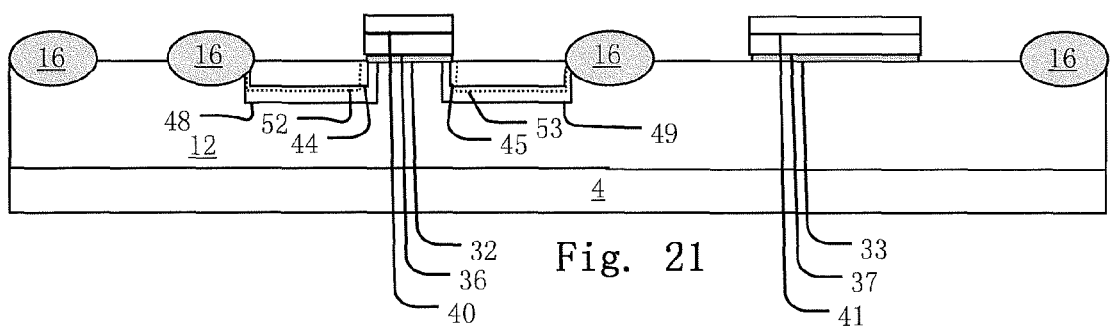
FIG. 21 shows a cross-sectional view of part of the process of FIGS. 15-26 of making a single gate memory cell with a transistor and a capacitor in the same well, in particular implanting two additional doping regions on both sides of the gate region of the transistor and overlapping the source and drain regions to be formed, one having the opposite (P) doping type as the source and drain regions to be formed, and another one having the same (N) doping type as the source and drain regions to be formed, and resembles the step of FIG. 8.

FIG. 21 shows a cross-sectional view of part of the process of FIGS. 15-26 of making a single gate memory cell with a transistor and a capacitor in the same well, in particular implanting two additional doping regions on both sides of the gate region of the transistor and overlapping the source and drain regions to be formed, one (48 and 49) having the opposite (P) doping type as the source and drain regions to be formed, and another one (52 and 53) having the same (N) doping type as the source and drain regions to be formed, and resembles the step of FIG. 8.

Figure 22:
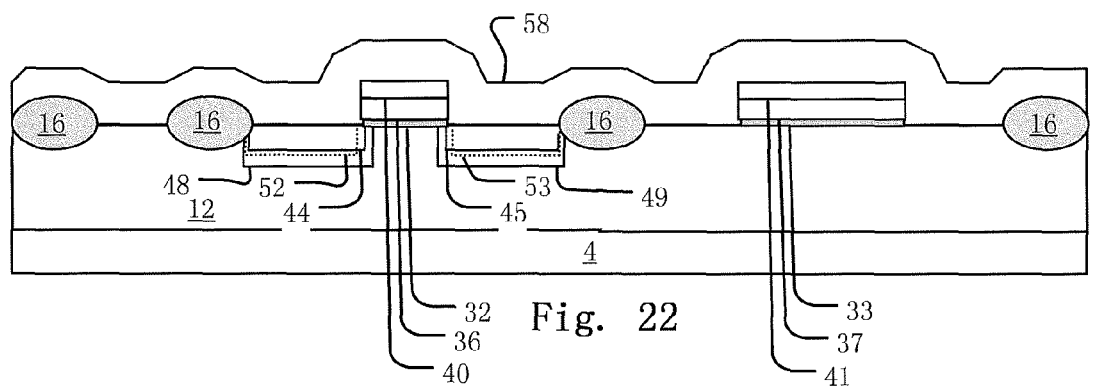
FIG. 22 shows a cross-sectional view of part of the process of FIGS. 15-26 of making a single gate memory cell with a transistor and a capacitor in the same well, in particular depositing a layer of oxide, and resembles the step of FIG. 9.

FIG. 22 shows a cross-sectional view of part of the process of FIGS. 15-26 of making a single gate memory cell with a transistor and a capacitor in the same well, in particular depositing a layer of oxide 58, and resembles the step of FIG. 9.

Figure 23:
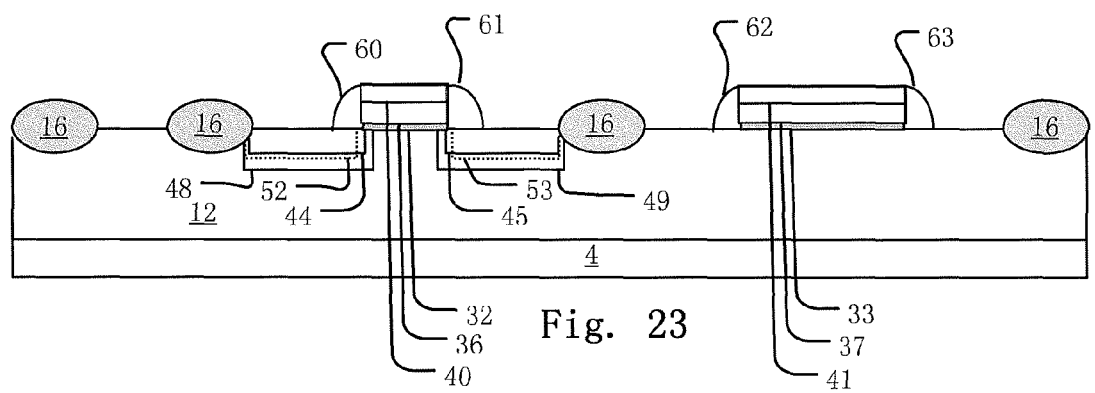
FIG. 23 shows a cross-sectional view of part of the process of FIGS. 15-26 of making a single gate memory cell with a transistor and a capacitor in the same well, in particular etching the layer of oxide to form sidewall spacers by the gate region, and resembles the step of FIG. 10.

FIG. 23 shows a cross-sectional view of part of the process of FIGS. 15-26 of making a single gate memory cell with a transistor and a capacitor in the same well, in particular etching the layer of oxide to form sidewall spacers 60 and 61 by the gate region of the transistor and sidewall spacers 62 and 63 by the gate region of the capacitor, and resembles the step of FIG. 10.

Figure 24:
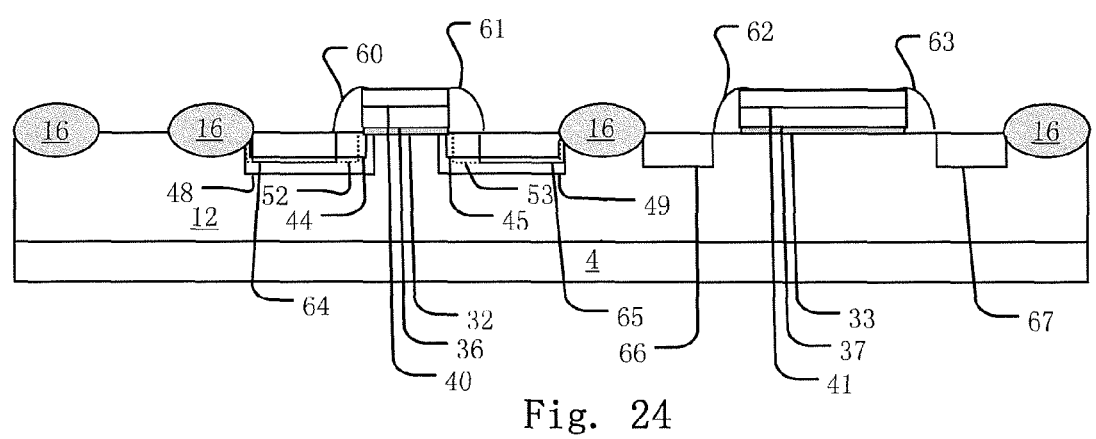
FIG. 24 shows a cross-sectional view of part of the process of FIGS. 15-26 of making a single gate memory cell with a transistor and a capacitor in the same well, in particular implanting the source and drain regions (N+) on either side of the gate region of the transistor, and regions having the same doping type (N+) on either side of the gate region of the capacitor, and resembles the step of FIG. 11.

FIG. 24 shows a cross-sectional view of part of the process of FIGS. 15-26 of making a single gate memory cell with a transistor and a capacitor in the same well, in particular implanting the source and drain regions 64 and 65 (N+) on either side of the gate region of the transistor, and regions 66 and 67 having the same doping type (N+) on either side of the gate region of the capacitor, and resembles the step of FIG. 11.

Figure 25:
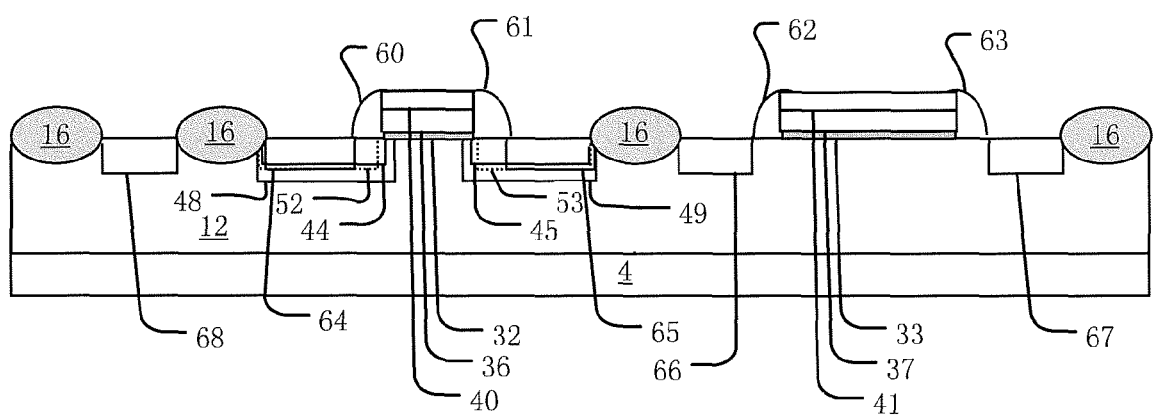
FIG. 25 shows a cross-sectional view of part of the process of FIGS. 15-26 of making a single gate memory cell with a transistor and a capacitor in the same well, in particular implanting a region having the opposite doping type (P+) as the source and drain regions, and resembles the step of FIG. 12.

FIG. 25 shows a cross-sectional view of part of the process of FIGS. 15-26 of making a single gate memory cell with a transistor and a capacitor in the same well, in particular implanting a region 68 having the opposite doping type (P+) as the source and drain regions to be formed, and resembles the step of FIG. 12.

Figure 26:
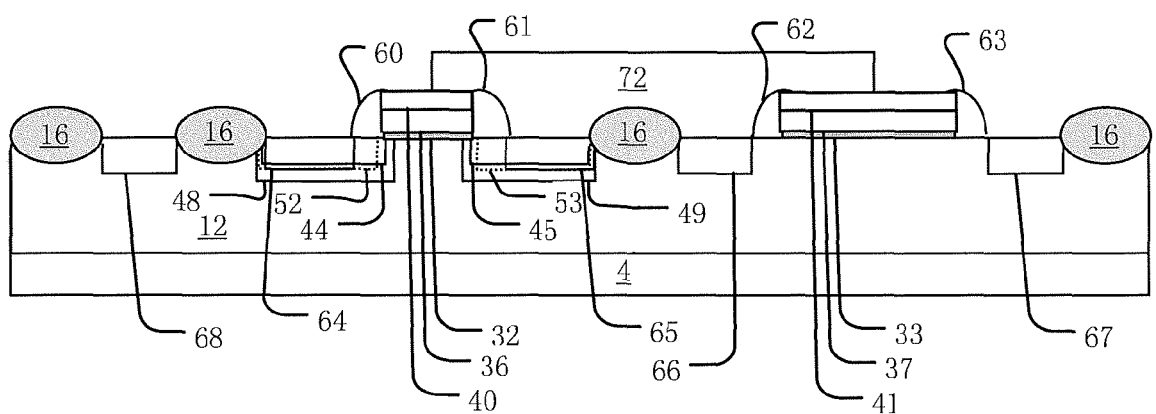
FIG. 26 shows a cross-sectional view of part of the process of FIGS. 15-26 of making a single gate memory cell with a transistor and a capacitor in the same well, in particular depositing the single gate connecting the gate regions of the transistor and the capacitor, and resembles the step of FIG. 13.

FIG. 26 shows a cross-sectional view of part of the process of FIGS. 15-26 of making a single gate memory cell with a transistor and a capacitor in the same well, in particular depositing the single gate 72 connecting the gate regions of the transistor and the capacitor, and resembles the step of FIG. 13.

Figure 27:
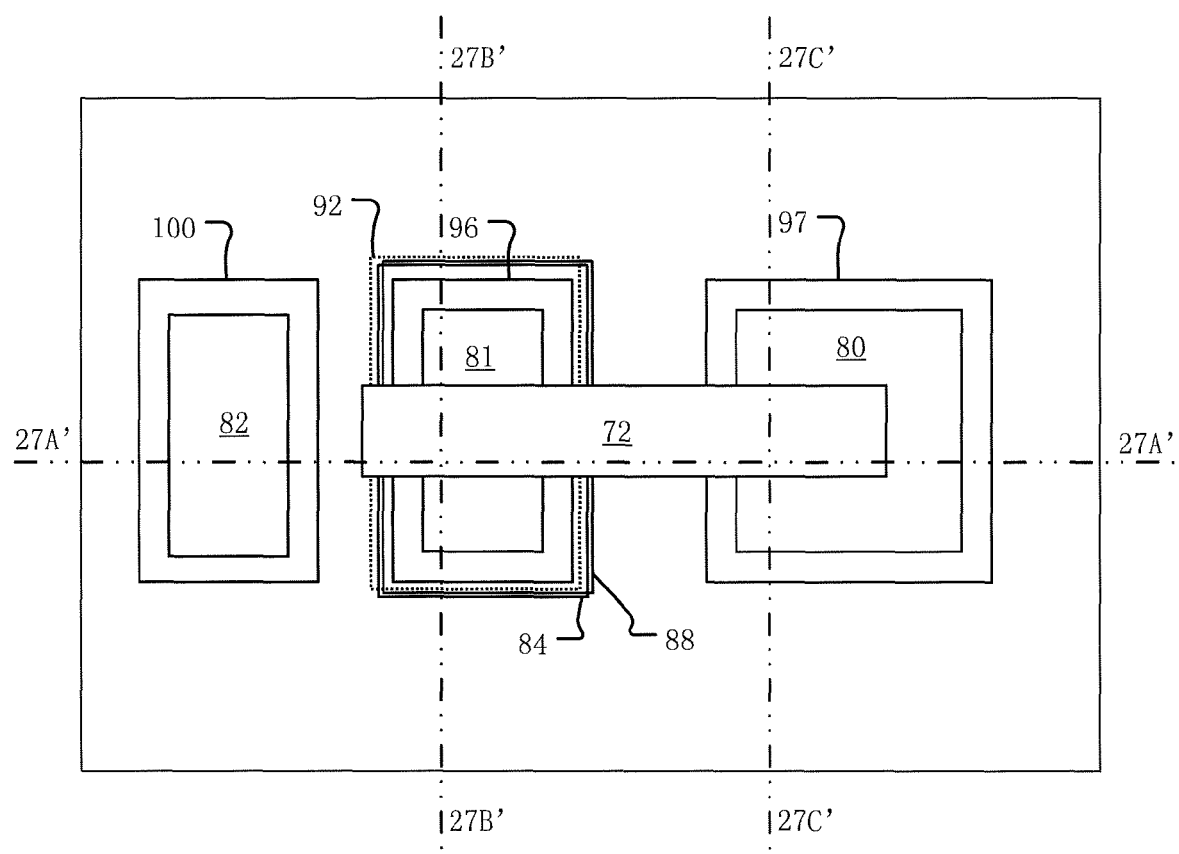
FIG. 27 shows a top view of a single gate memory cell with a transistor and a capacitor in the same well.

FIG. 27 shows a top view of a single gate memory cell with a transistor and a capacitor in the same well. Oxide definition window 82 partly covers P+ implant window 100. Oxide definition window 81 partly covers N+ implant window 96. N+ implant window 96 partly covers N− doping window 84, P doping window 88, and N doping window 92. Oxide definition window 80 partly covers N+ implant window 97. Floating gate 72 overlaps both oxide definition windows 80 and 81. Cross-sectional lines 27A'-27A', 27B'-27B', and 27C'-27C' designate the cross-sectional views of FIGS. 27A-27C.

Figure 27A:
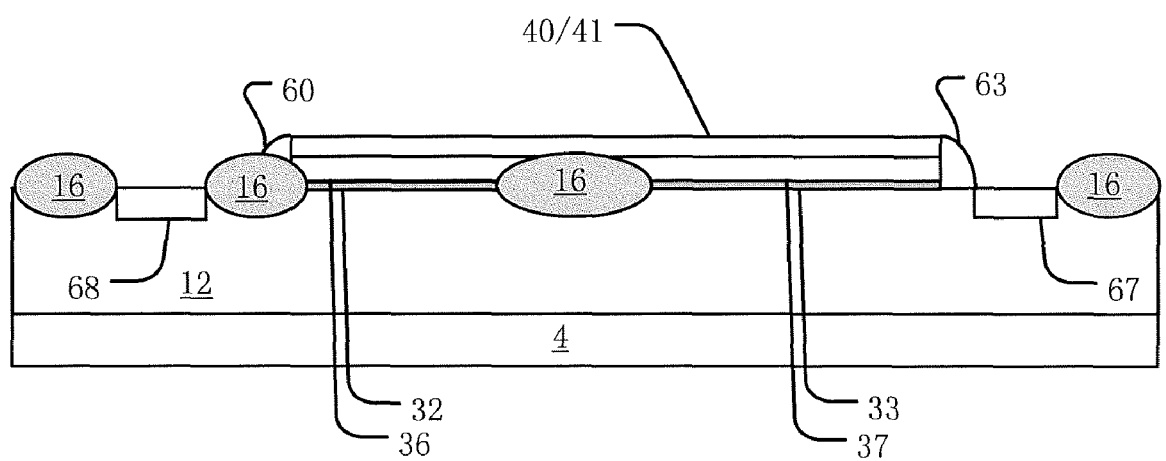
FIGS. 27A-C show cross-sectional views of the single gate memory cell with the transistor and the capacitor in different wells having different doping types, of FIG. 27.
Figure 27B:
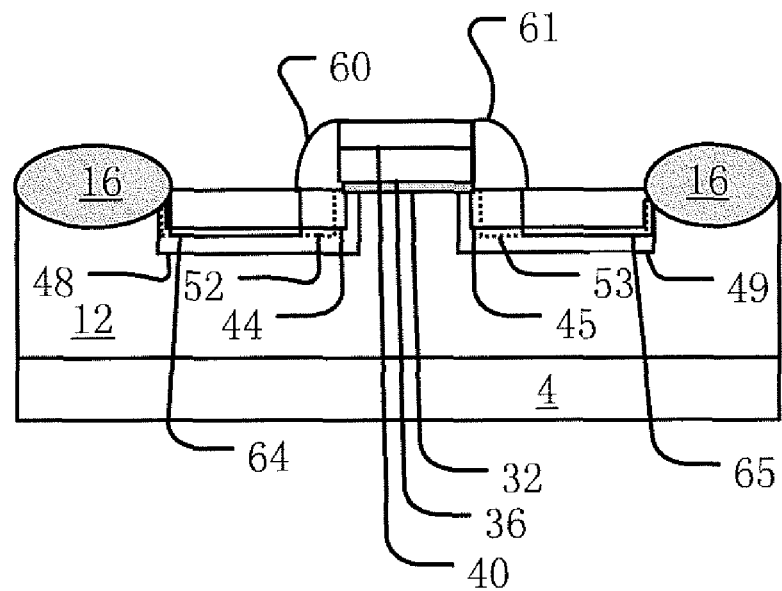
Figure 27C:
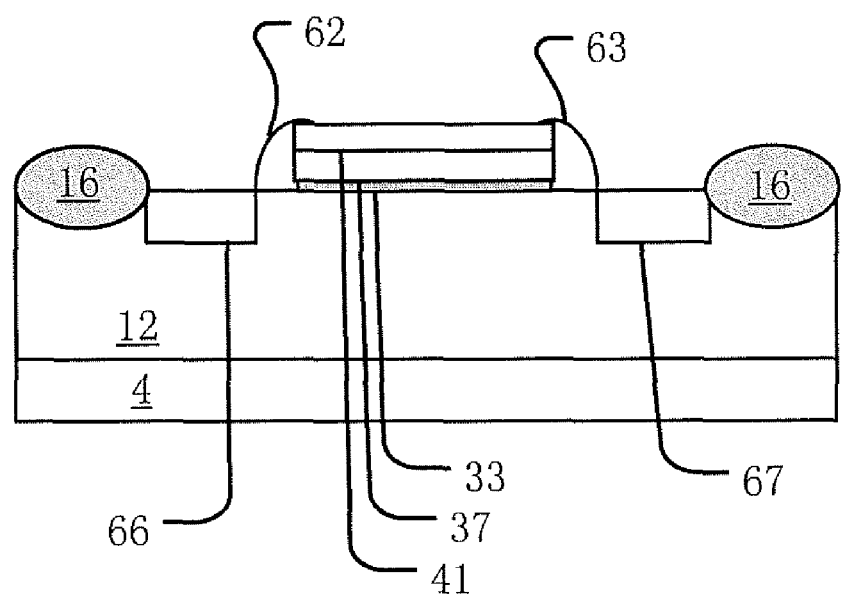

FIGS. 27A-C show cross-sectional views of the single gate memory cell with the transistor and the capacitor in different wells having different doping types, of FIG. 27. FIG. 27A shows the cross-section corresponding to cross-sectional line 27A'-27A' in FIG. 27. FIG. 27B shows the cross-section corresponding to cross-sectional line 27B'-27B' in FIG. 27. FIG. 27C shows the cross-section corresponding to cross-sectional line 27C'-27C' in FIG. 27.

Figure 28:
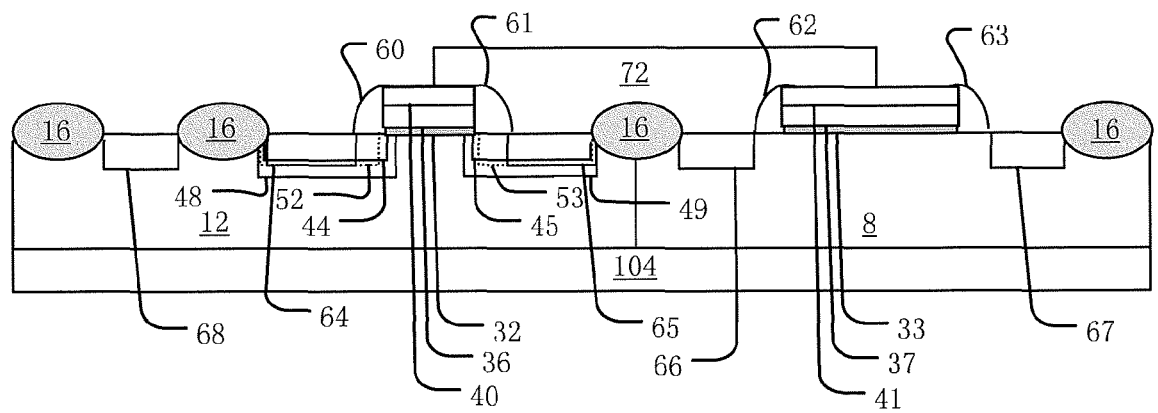
FIG. 28 shows a cross-sectional view of a single gate memory cell with a transistor and a capacitor in different wells having different doping types, and resembles FIG. 13, but includes an epitaxial surface.

FIG. 28 shows a cross-sectional view of a single gate memory cell with a transistor and a capacitor in different wells having different doping types, and resembles FIG. 13, but includes an epitaxial surface 104.

Figure 29:
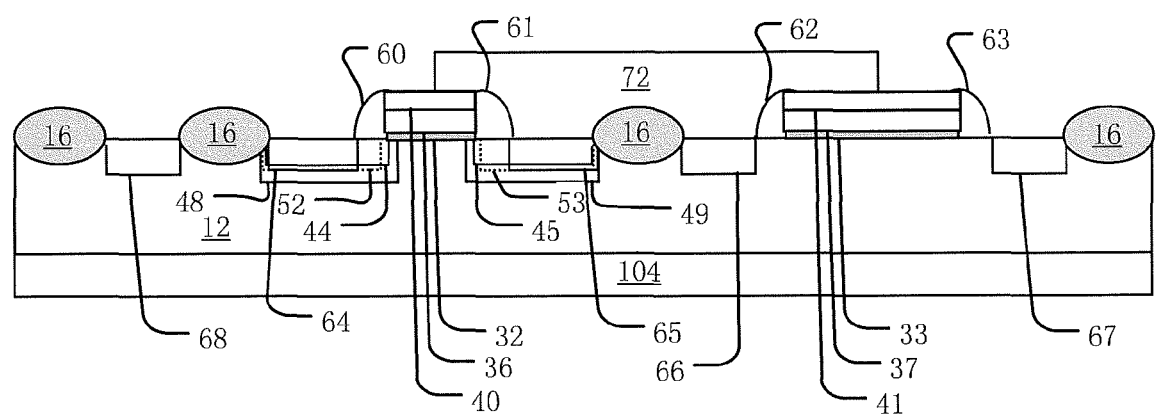
FIG. 29 shows a cross-sectional view of a single gate memory cell with a transistor and a capacitor in the same well, and resembles FIG. 26, but includes an epitaxial surface.

FIG. 29 shows a cross-sectional view of a single gate memory cell with a transistor and a capacitor in the same well, and resembles FIG. 26, but includes an epitaxial surface 104.

Table 1 below shows experimental data for exemplary nonvolatile memory cells as described herein, with 5V one time programming cells. According to the upper part of the table, process 1 has just implant 44,45, process 2 has two sets of implants 44,45, process 3 has implants 44,45; and 52,53, and process 4 has implants 44,45; 48,49; and 52,53. Vt is threshold voltage. BVD is breakdown voltage or punch through voltage of a long channel. Ids is channel current. Isb is substrate current, and is an indicator for hot carriers that program the memory cell. Vpt is punch through or voltage breakdown voltage of a short channel. Id is leakage current.

TABLE 1

5 V one time programming cells

|  | Process 1 | Process 2 | Process 3 | Process 4 |
|---|---|---|---|---|
| Implant 44, 45 (e.g., N-LDD) | X | X | X | X |
| 2nd implant 44, 45 (e.g. N-LDD) |  | X |  |  |
| Implant 52, 53 (e.g., N-hot carrier) |  |  | X |  |
| Implants 48, 49, 52, 53 (e.g., P-pocket, N-hot carrier) |  |  |  | X |
| Sample 1 Data: W/L 20 um/20 um | | | | |
| Vt (V) | 0.75 | 0.74 | 0.76 | 0.76 |
| BVD (V) | 11.5 | 12.3 | 10.6 | 10.1 |
| Sample 2 Data: W/L 20 um/0.5 um | | | | |
| Vt (V) | 0.72 | 0.63 | 0.77 | 0.76 |
| Ids (mA) Vgs = Vds = 5 V | 9.11 | 12.8 | 10.7 | 11.2 |
| Isb (uA) Vds = 5.5 V | −58.2 | −308.8 | −341.6 | −517 |
| Vpt (V) @100 nA | 11.5 | 5.5 | 10.6 | 10.1 |
| Id (pA) Vd = 6 V | 22.1 | $4 \times 10^{-6}$ | 53.3 | 57.4 |
| Sample 3 Data: W/L 20 um/0.45 um | | | | |
| Vpt (V) @100 nA | 11.5 | 2.4 | 10.6 | 10.1 |

Table 2 below shows experimental data for exemplary nonvolatile memory cells as described herein, with 3V one time programming cells.

TABLE 2

3 V one time programming cells

|  | Process 1 | Process 2 | Process 3 | Process 4 |
|---|---|---|---|---|
| Implant 44, 45 (e.g., N-LDD) | X | X | X | X |
| 2nd implant 44, 45 (e.g. N-LDD) |  | X |  |  |
| Implant 52, 53 (e.g., N-hot carrier) |  |  | X |  |
| Implants 48, 49, 52, 53 (e.g., P-pocket, N-hot carrier) |  |  |  | X |
| Sample 1 Data: W/L 20 um/20 um | | | | |
| Vt (V) | 0.55 | 0.56 | 0.56 | 0.56 |
| BVD (V) | 12.2 | 11.6 | 9.9 | 9.6 |
| Sample 2 Data: W/L 20 um/0.5 um | | | | |
| Vt (V) | 0.55 | 0.50 | 0.54 | 0.61 |
| Ids (mA) Vgs = Vds = 3 V | 7.2 | 9.8 | 9.2 | 8.7 |
| Isb (uA) Vds = 3.3 V | −4 | −11.14 | −16.08 | −19.95 |
| Vpt (V) @100 nA | 12 | 5.8 | 9.9 | 9.6 |
| Id (pA) Vd = 4 V | 27 | 3034 | 62 | 17 |
| Sample 3 Data: W/L 20 um/0.45 um | | | | |
| Vpt (V) @100 nA | 12 | 2.5 | 7.4 | 9.6 |

Tables 1 and 2 show that Isb has the largest magnitude for process 4 with implants 44,45; 48,49; and 52,53. Because Isb or substrate current, is an indicator for hot carriers that program the memory cell, process 4 is associated with high programmability of the nonvolatile memory cells. Process 3 is also associated with high substrate current and high programmability of the nonvolatile memory cells, though not as much as process 4. Process 4 is also associate with good short channel effects, as shown by the high Vpt punch through voltage for sample 3. Processes 3 and 4 have good short channel effects, for sample 2.

Table 3 below shows example ranges of the various implants. The energies are greater than 20 keV. Also, an example wafer resistance range is 8-100 ohms.

TABLE 3

| Implantation Dosages | |
|---|---|
| Implant 8 (e.g., n-well) | $10^{11}$-$10^{13}$ cm$^{-2}$ |
| Implant 12 (e.g., p-well) | $10^{11}$-$10^{13}$ cm$^{-2}$ |
| Implant 44, 45 (e.g. N-LDD) | $10^{12}$-$10^{13}$ cm$^{-2}$ |
| Implant 48, 49 (e.g., P-pocket) | $10^{11}$-$10^{14}$ cm$^{-2}$ |
| Implant 52, 53 (e.g., N-hot carrier) | $10^{12}$-$10^{14}$ cm$^{-2}$ |
| Implant 64, 65 (e.g., N+ source, drain) | $10^{15}$ cm$^{-2}$ |

Figure 30:
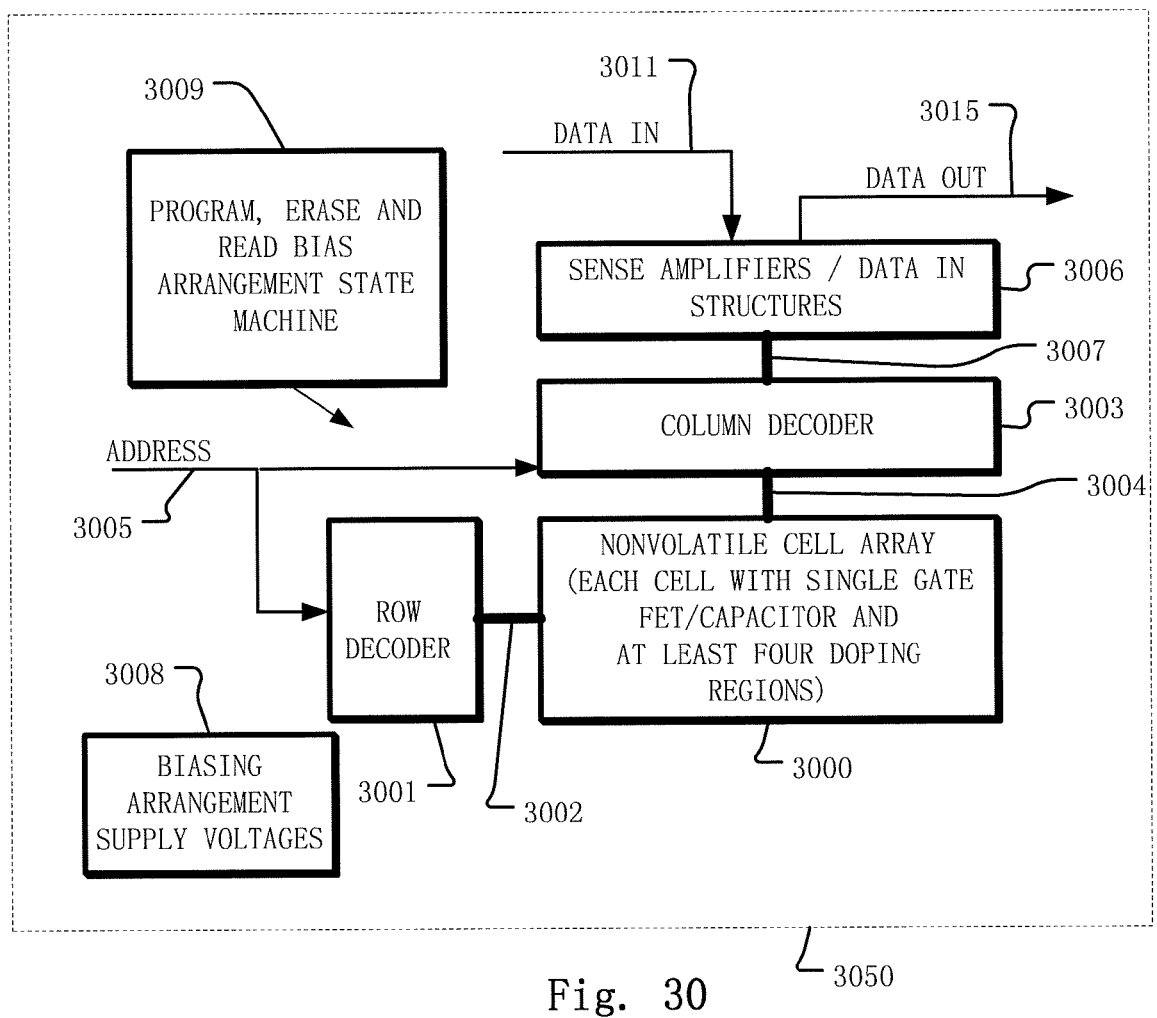
FIG. 30 shows an example of a nonvolatile memory integrated circuit with a memory array of single gate memory cells with a transistor and a capacitor.

FIG. 30 shows an example of a nonvolatile memory integrated circuit with a memory array of single gate memory cells with a transistor and a capacitor. The integrated circuit 3050 includes a memory array 3000 implemented using programmable memory cells, each cell being a single gate FET and capacitor cell as described herein, with at least four doping regions in the transistor. A row decoder 3001 is coupled to a plurality of word lines 3002 arranged along rows in the memory array 3000. A column decoder 3003 is coupled to a plurality of bit lines 3004 arranged along columns in the memory array 3000. Addresses are supplied on bus 3005 to column decoder 3003 and row decoder 3001. Sense amplifiers and data-in structures in block 3006 are coupled to the column decoder 3003 via data bus 3007. Data is supplied via the data-in line 3011 from input/output ports on the integrated circuit 3050, or from other data sources internal or external to the integrated circuit 3050, to the data-in structures in block 3006. Data is supplied via the data-out line 3015 from the sense amplifiers in block 3006 to input/output ports on the integrated circuit 3050, or to other data destinations internal or external to the integrated circuit 3050. A bias arrangement state machine 3009 controls the application of bias arrangement supply voltages 3008.

Another embodiment uses p-channel transistors, and accordingly exchanges the p-regions for n-regions, and exchanges the n-regions for p-regions.

Examples of operation are described as follows.

An embodiment of FIG. 13 has the following example operations with example voltage settings:

Channel F-N erase to low threshold voltage (electrons directed from the gate region of the transistor into the p-well 12)

| Terminal | Voltage |
|---|---|
| Control gate 67 | Sufficiently− |
| Drain 64 | Floating |
| Source 65 | Sufficiently+ |
| Bulk 68 | Sufficiently+ |

Edge F-N erase to low threshold voltage (electrons directed from the gate region of the transistor into the p-well 12 in the direction of the source (65))

| Terminal | Voltage |
|---|---|
| Control gate 67 | Sufficiently− |
| Drain 64 | Floating |
| Source 65 | Sufficiently+ |
| Bulk 68 | Ground |

Channel F-N program to high threshold voltage (electrons directed from the p-well 12 into the gate region of the transistor)

| Terminal | Voltage |
|---|---|
| Control gate 67 | Sufficiently+ |
| Drain 64 | Floating |
| Source 65 | Sufficiently− |
| Bulk 68 | Sufficiently− |

Hot electron program to high threshold voltage (electrons directed from the p-well 12 into the gate region of the transistor)

| Terminal | Voltage |
|---|---|
| Control gate 67 | Sufficiently+ |
| Drain 64 | Sufficiently+ |
| Source 65 | Ground |
| Bulk 68 | Ground |

An embodiment of FIG. 26 has the following example operations with example voltage settings:

Channel F-N erase to low threshold voltage (electrons directed from the gate region of the transistor into the p-well 12)

| Terminal | Voltage |
|---|---|
| Control gate 67 | Sufficiently− |
| Drain 64 | Floating |
| Source 65 | Sufficiently+ |
| Bulk 68 | Sufficiently+ |

Edge F-N erase to low threshold voltage (electrons directed from the gate region of the transistor into the p-well 12 in the direction of the source (65))

| Terminal | Voltage |
|---|---|
| Control gate 67 | Sufficiently− |
| Drain 64 | Floating |
| Source 65 | Sufficiently+ |
| Bulk 68 | Ground |

Channel F-N program to high threshold voltage (electrons directed from the p-well 12 into the gate region of the transistor)

| Terminal | Voltage |
|---|---|
| Control gate 67 | Sufficiently+ |
| Drain 64 | Floating |
| Source 65 | Sufficiently− |
| Bulk 68 | Sufficiently− |

Hot electron program to high threshold voltage (electrons directed from the p-well 12 into the gate region of the transistor)

| Terminal | Voltage |
|---|---|
| Control gate 67 | Sufficiently+ |
| Drain 64 | Sufficiently+ |
| Source 65 | Ground |
| Bulk 68 | Ground |

In some embodiments, multiple control gates, such as 66 and 67 both receive the control gate voltage for more uniform voltage control of the capacitor region.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory integrated circuit, comprising:
   a semiconductor substrate;
   a nonvolatile memory device on the semiconductor substrate, including:
   a transistor on the semiconductor substrate controlled by a gate region and by a source region and a drain region having a first doping type, comprising:

first doping regions having the first doping type, the first doping regions positioned on both sides of the gate region, the first doping regions overlapping the source region and the drain region;
second doping regions having a second doping type opposite to the first doping type, the second doping regions positioned on both sides of the gate region, the second doping regions overlapping the source region and the drain region;
third doping regions having the first doping type, the third doping regions positioned on both sides of the gate region, the third doping regions overlapping the source region and the drain region;
fourth doping regions having the first doping type, the fourth doping regions positioned on both sides of the gate region, the fourth doping regions defining the source region and the drain region;
a capacitor on the semiconductor substrate controlled by a gate region;
a shared floating gate connected to the gate region of the transistor and the gate region of the capacitor.

2. The circuit of claim 1, wherein the substrate has the second doping type.

3. The circuit of claim 1, further comprising:
an epitaxial layer on the substrate having the second doping type, wherein the transistor is on the epitaxial layer.

4. The circuit of claim 1, further comprising:
a well on the substrate having the second doping type, wherein the transistor is on the well.

5. The circuit of claim 1, further comprising:
an epitaxial layer on the substrate having the second doping type, wherein the capacitor is on the epitaxial layer.

6. The circuit of claim 1, further comprising:
a well on the substrate having the first doping type, wherein the capacitor is on the well.

7. The circuit of claim 1, further comprising:
a well on the substrate having the second doping type, wherein the capacitor is on the well.

8. The circuit of claim 1, further comprising:
a well on the substrate having the second doping type, wherein the transistor and the capacitor are on the well.

9. The circuit of claim 1, further comprising:
an epitaxial layer on the substrate having the second doping type, wherein the transistor is on the epitaxial layer; and
a well on the epitaxial layer having the second doping type, wherein the capacitor is on the well.

10. The circuit of claim 1, further comprising:
an epitaxial layer on the substrate having the second doping type, wherein the transistor is on the epitaxial layer; and
a well on the epitaxial layer having the first doping type, wherein the capacitor is on the well.

11. The circuit of claim 1, further comprising:
a first well on the substrate having the first doping type, wherein the capacitor is on the first well; and
a second well on the substrate having the second doping type, wherein the transistor is on the second well.

12. The circuit of claim 1, further comprising:
an epitaxial layer on the substrate having the second doping type, wherein the transistor is on the epitaxial layer; and
a first well on the epitaxial layer having the first doping type, wherein the capacitor is on the first well; and
a second well on the epitaxial layer having the second doping type, wherein the transistor is on the second well.

13. The circuit of claim 1, further comprising:
spacers adjacent to the gate region of the transistor, the spacers partly covering the first doping region, the second doping region, and the third doping region.

14. A nonvolatile memory integrated circuit, comprising:
a semiconductor substrate;
a plurality of nonvolatile memory devices on the semiconductor substrate, each including:
a transistor on the semiconductor substrate controlled by a gate region and by a source region and a drain region having a first doping type, comprising:
first doping regions having the first doping type, the first doping regions positioned on both sides of the gate region, the first doping regions overlapping the source region and the drain region;
second doping regions having a second doping type opposite to the first doping type, the second doping regions positioned on both sides of the gate region, the second doping regions overlapping the source region and the drain region;
third doping regions having the first doping type, the third doping regions positioned on both sides of the gate region, the third doping regions overlapping the source region and the drain region;
fourth doping regions having the first doping type, the fourth doping regions positioned on both sides of the gate region, the fourth doping regions defining the source region and the drain region;
a capacitor on the semiconductor substrate controlled by a gate region;
a shared floating gate connected to the gate region of the transistor and the gate region of the capacitor.

15. The circuit of claim 14, further comprising:
a well on the substrate having the second doping type, wherein the capacitors of the plurality of nonvolatile memory devices are on the well.

16. The circuit of claim 14, further comprising:
a well on the substrate having the first doping type, wherein the capacitors of the plurality of nonvolatile memory devices are on the well.

17. The circuit of claim 14, further comprising:
a first well on the substrate having the first doping type, wherein the capacitors of the plurality of nonvolatile memory devices are on the first well; and
a second well on the substrate having the second doping type, wherein the transistors of the plurality of nonvolatile memory devices are on the second well.

18. A method of manufacturing a nonvolatile memory integrated circuit, comprising:
providing a semiconductor substrate;
providing a nonvolatile memory device on the semiconductor substrate, including:
providing 1) a transistor on the semiconductor substrate controlled by a first gate region and by a source region and a drain region having a first doping type, and 2) a capacitor on the semiconductor substrate controlled by a second gate region, comprising:
providing first doping regions having the first doping type, the first doping regions positioned on both sides of the first gate region, the first doping regions overlapping the source region and the drain region;
providing second doping regions having a second doping type opposite to the first doping type, the second doping regions positioned on both sides of the first gate region, the second doping regions overlapping the source region and the drain region;
providing third doping regions having the first doping type, the third doping regions positioned on both sides of the first gate region, the third doping regions overlapping the source region and the drain region;

providing fourth doping regions having the first doping type, the fourth doping regions positioned on both sides of the first gate region and on both sides of the second gate region, the fourth doping regions defining the source region and the drain region;

providing a shared floating gate connected to the first gate region of the transistor and the second gate region of the capacitor.

19. The method of claim 18, further comprising:

providing a well on the substrate having the second doping type, wherein the capacitor is on the well.

20. The method of claim 18, further comprising:

providing a well on the substrate having the first doping type, wherein the capacitor is on the well.

21. The method of claim 18, further comprising:

providing a first well on the substrate having the first doping type, wherein the capacitor is on the first well; and providing a second well on the substrate having the second doping type, wherein the transistor is on the second well.

* * * * *